(12) United States Patent
Mochizuki et al.

(10) Patent No.: US 11,227,937 B2
(45) Date of Patent: Jan. 18, 2022

(54) UNIFORM INTERFACIAL LAYER ON VERTICAL FIN SIDEWALLS OF VERTICAL TRANSPORT FIELD-EFFECT TRANSISTORS

(71) Applicant: International Business Machines Corporation, Armonk, NY (US)

(72) Inventors: Shogo Mochizuki, Clifton Park, NY (US); ChoongHyun Lee, Rensselaer, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/273,331

(22) Filed: Feb. 12, 2019

(65) Prior Publication Data

US 2020/0259000 A1  Aug. 13, 2020

(51) Int. Cl.
| | |
|---|---|
| *H01L 29/66* | (2006.01) |
| *H01L 29/78* | (2006.01) |
| *H01L 21/8234* | (2006.01) |

(52) U.S. Cl.
CPC ............ *H01L 29/66666* (2013.01); *H01L 21/823487* (2013.01); *H01L 29/6653* (2013.01); *H01L 29/6656* (2013.01); *H01L 29/7827* (2013.01)

(58) Field of Classification Search
CPC .......... H01L 29/66666; H01L 29/7827; H01L 29/6653; H01L 21/823487; H01L 29/6656
See application file for complete search history.

(56) References Cited

U.S. PATENT DOCUMENTS

| | | | |
|---|---|---|---|
| 6,770,534 B2 | 8/2004 | Cho et al. | |
| 9,530,866 B1 * | 12/2016 | Zhang | H01L 29/0676 |
| 9,786,788 B1 | 10/2017 | Anderson et al. | |
| 9,799,749 B1 | 10/2017 | Bi et al. | |
| 9,799,777 B1 * | 10/2017 | Balakrishnan | H01L 21/823487 |
| 2006/0261406 A1 | 11/2006 | Chen | |
| 2007/0190766 A1 * | 8/2007 | Seo | H01L 29/105 438/585 |
| 2015/0357432 A1 | 12/2015 | Lin et al. | |
| 2016/0240681 A1 | 8/2016 | Ching et al. | |
| 2017/0062436 A1 | 3/2017 | Guillorn et al. | |
| 2018/0053821 A1 * | 2/2018 | Mallela | H01L 21/764 |
| 2018/0233501 A1 * | 8/2018 | Balakrishnan | H01L 29/0649 |
| 2020/0058766 A1 * | 2/2020 | Lee | H01L 21/31116 |

* cited by examiner

*Primary Examiner* — Aaron J Gray
(74) *Attorney, Agent, or Firm* — Erik Johnson; Ryan, Mason & Lewis, LLP

(57) ABSTRACT

A method of forming a semiconductor structure includes patterning a hard mask layer over a top surface of a substrate. The method also includes forming a first portion of one or more vertical fins below the patterned hard mask layer. The method further includes forming a top spacer on sidewalls of the hard mask layer and the first portion of the one or more vertical fins. The method further includes forming a second portion of the one or more vertical fins in the substrate below the top spacer and trimming sidewalls of the second portion of the one or more vertical fins. The method further includes forming an interfacial layer on the trimmed sidewalls of the second portion of the one or more vertical fins. The one or more vertical fins provide one or more vertical transport channels for one or more vertical transport field-effect transistors.

17 Claims, 14 Drawing Sheets

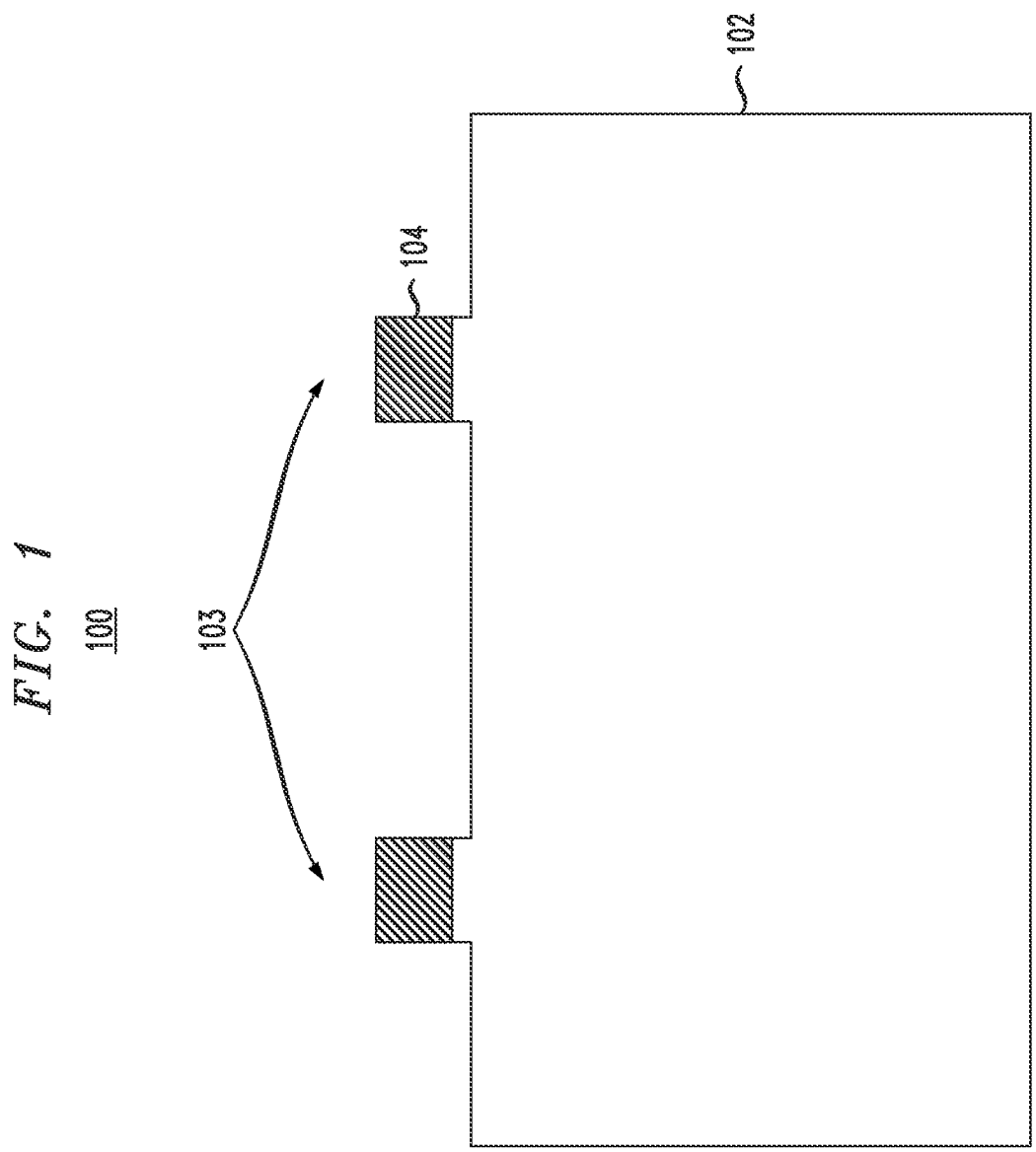
FIG. 1
100
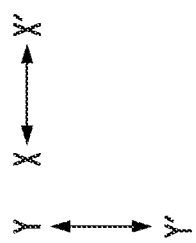

400

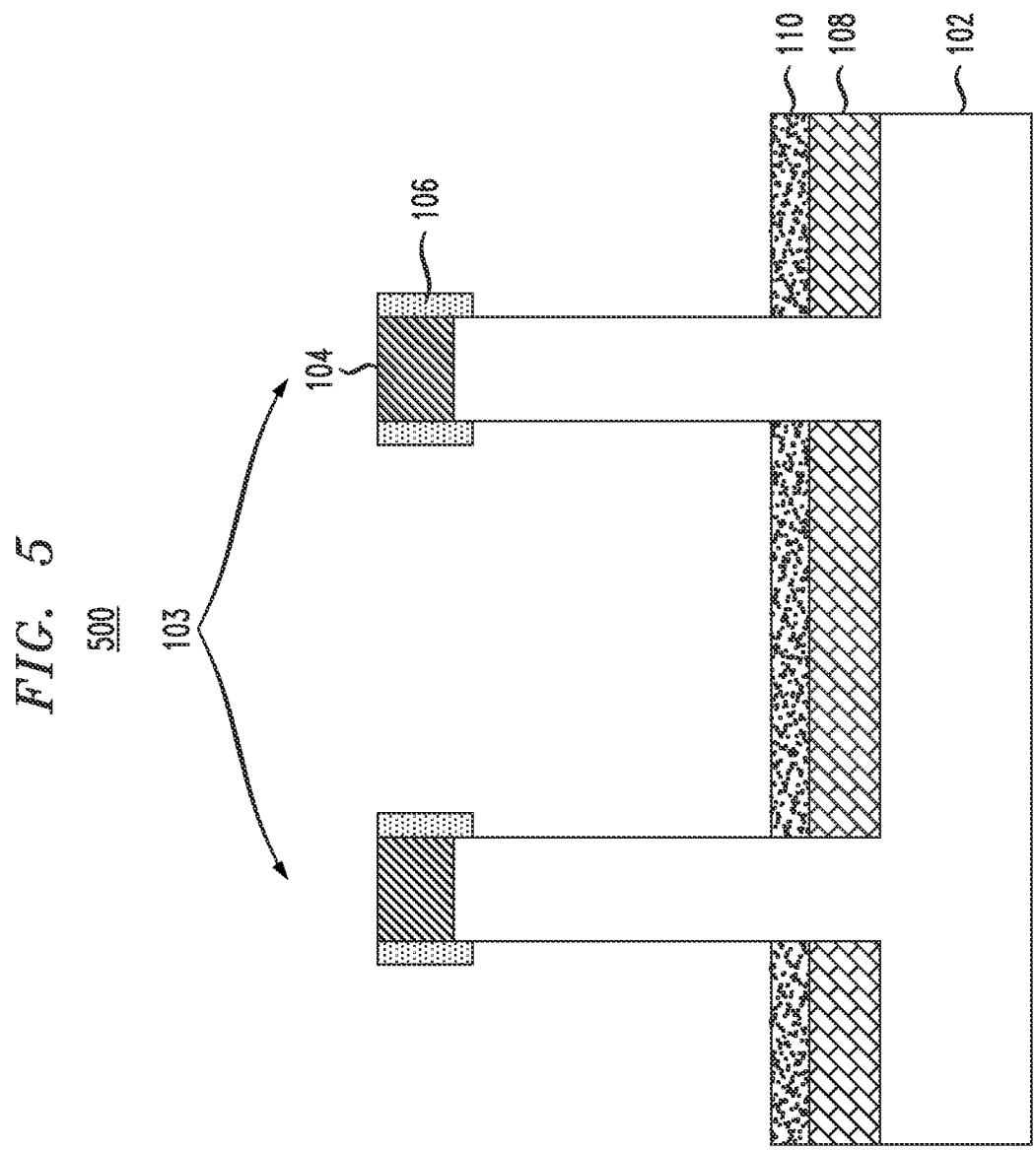
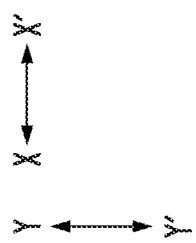
FIG. 5

700

1400 ial Layer on
UNIFORM INTERFACIAL LAYER ON VERTICAL FIN SIDEWALLS OF VERTICAL TRANSPORT FIELD-EFFECT TRANSISTORS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical transport field-effect transistors with a uniform interfacial layer on the vertical fin sidewalls.

In one embodiment, a method of forming a semiconductor structure comprises patterning a hard mask layer over a top surface of a substrate, forming a first portion of one or more vertical fins below the patterned hard mask layer, forming a top spacer on sidewalls of the hard mask layer and the first portion of the one or more vertical fins, forming a second portion of the one or more vertical fins in the substrate below the top spacer, trimming sidewalls of the second portion of the one or more vertical fins, and forming an interfacial layer on the trimmed sidewalls of the second portion of the one or more vertical fins. The one or more vertical fins provide one or more vertical transport channels for one or more vertical transport field-effect transistors.

In another embodiment, a semiconductor structure comprises a substrate, one or more vertical fins disposed over a top surface of the substrate, the one or more vertical fins comprising a first portion proximate top surfaces thereof and a second portion below the first portion, a top spacer disposed on sidewalls of the first portion of the one or more vertical fins, and an interfacial layer disposed on sidewalls of the second portion of the one or more vertical fins. The one or more vertical fins provide vertical transport channels for one or more vertical transport field-effect transistors.

In another embodiment, an integrated circuit comprises a vertical transport field-effect transistor structure comprising a substrate, one or more vertical fins disposed over a top surface of the substrate, the one or more vertical fins comprising a first portion proximate top surfaces thereof and a second portion below the first portion, top spacers disposed on sidewalls of the first portion of the one or more vertical fins, and an interfacial layer disposed on sidewalls of the second portion of the one or more vertical fins. The one or more vertical fins provide vertical transport channels for one or more vertical transport field-effect transistors.

BRIEF DESCRIPTION OF THE DRAWINGS

FIG. 1 depicts a cross-sectional view of fin patterning in a semiconductor structure, according to an embodiment of the invention.

FIG. 5 depicts a cross-sectional view of the FIG. 4 structure following formation of a bottom source/drain region and a bottom spacer, according to an embodiment of the invention.

DETAILED DESCRIPTION

Figure 2:
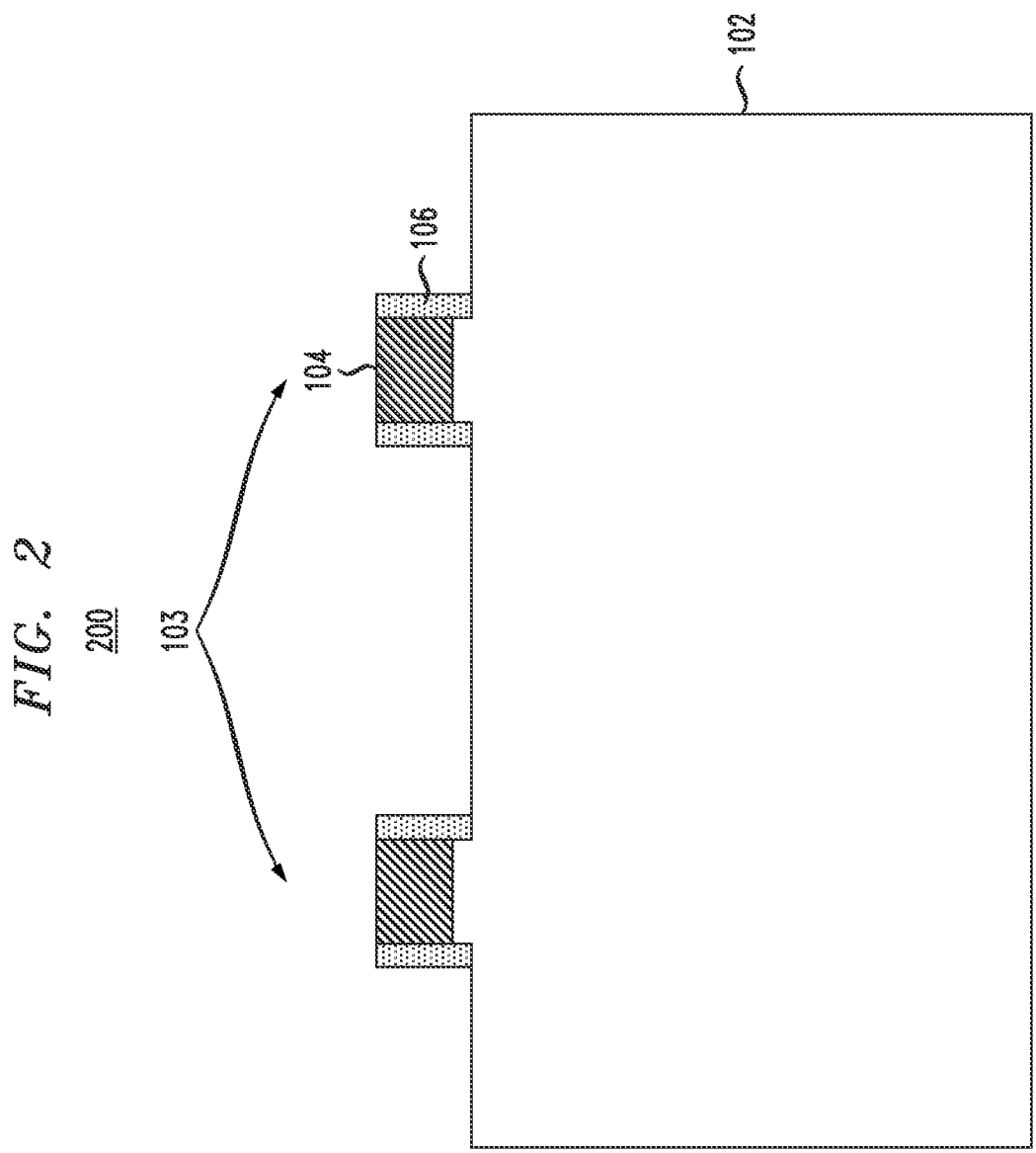
FIG. 2 depicts a cross-sectional view of the FIG. 1 structure following spacer formation, according to an embodiment of the invention.

Illustrative embodiments of the invention may be described herein in the context of illustrative methods for forming a uniform interfacial layer on vertical fin sidewalls of vertical transport field-effect transistors, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Vertical transport FETs (VTFETs) are being pursued as viable CMOS architectures for scaling to 7 nanometers (nm) and beyond. VTFETs provide the opportunity for further device scaling compared with other device architectures. VTFETs have various potential advantages over other conventional structures such as fin field-effect transistors (FinFETs). Such advantages may include improvements in density, performance, power consumption, and integration.

VTFETs may be formed as follows. One or more fins are patterned in a substrate, such as by patterning a hard mask over the substrate and then etching exposed regions of the substrate to form the fins. A bottom source/drain region is formed over the substrate and surrounding a bottom portion of the fins. A bottom spacer is then formed over bottom source/drain region. Next, an interfacial layer (IL) is formed on sidewalls of the fins (e.g., sidewalls between the bottom spacer and the hard mask formed over each of the fins). A gate stack is then formed. The gate stack may include depositing a gate dielectric (e.g., a high-k dielectric layer) followed by depositing a gate conductor layer (e.g., a work function metal (WFM) layer). An organic planarization layer (OPL) may then be formed over the structure. The OPL is then recessed along with the gate stack to expose a portion of the hard mask that is formed over each of the fins. A gate encapsulation layer (e.g., a nitride liner) is then formed over the structure, followed by fill with an oxide (e.g., a flowable oxide formed using flowable chemical vapor deposition (FCVD) techniques). The structure is then planarized (e.g., using chemical mechanical planarization (CMP)) to remove portions of the gate encapsulation layer thus exposing a top surface of the hard mask layer formed over each of the fins. The hard mask layer formed over each of the fins is then removed, which exposes a top of the IL. Pulling the hard mask layer may also remove portions of the gate encapsulation layer, as both the hard mask layer and the gate encapsulation layer may be formed of nitride materials. The gate stack is then recessed, and a top spacer is formed (e.g., using a divot deposition technique). Top source/drain regions are formed over each of the fins, followed by formation of top contacts.

Pulling the hard mask layer formed over each of the fins, as noted above, exposes the top edge of the IL. As a result, there may be IL re-growth due to the exposure of the top edge of the IL. In some cases, for example, there may be approximately 5 angstroms (Å) IL re-growth on the vertical fin sidewalls. This re-growth is the result of the processing used to recess the gate stack (e.g., the high-k dielectric acting as the gate dielectric and the WFM layer acting as the gate conductor). For example, the etchant used to recess the gate stack prior to deposition of the top spacer causes IL re-growth or damage. This leads to charge trapping, and overall gate stack reliability degradation.

Some embodiments provide techniques for forming VTFETs that prevent IL re-growth by eliminating IL edge exposure. Thus, VTFETs may be formed which have a uniform IL on vertical fin sidewalls. Preventing the IL re-growth and damage will improve the resulting performance of the VTFETs.

Illustrative processes for forming a uniform IL on vertical fin sidewalls of VTFETs will now be described with respect to FIGS. 1-13.

FIG. 1 shows a cross-sectional view 100 of a semiconductor structure including a substrate 102 with partial fin patterning of vertical fins 103 utilizing a hard mask layer 104 patterned over portions of the substrate 102. The hard mask layer 104 may initially be formed over the entire top surface of the substrate 102, followed by patterning to leave the hard mask layer 104 over portions of the substrate 102 where vertical fins are to be formed for a resulting VTFET structure. The cross-sectional view 100 of FIG. 1, along with the cross-sectional views of FIGS. 2-3 described below, are cross-sectional views taken perpendicular to a length of the vertical fins of the resulting VTFET structure.

The substrate 102 may be formed of any suitable semiconductor structure, including a bulk semiconductor, a semiconductor-on-insulator (SOI) substrate, etc. The substrate 102 may be formed of various silicon-containing materials including but not limited to silicon (Si), silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The horizontal thickness or width (in direction X-X') of the FIG. 1 structure may vary, such as based on the number of fins that are to be formed therefrom as described in further detail below. The vertical thickness or height (in direction Y-Y') of the FIG. 1 structure may be in the range of 10 nm to 200 nm, although other heights above or below this range may be used as desired for a particular application.

The hard mask layer 104 may be formed of a nitride such as silicon nitride (SiN), although other suitable materials may be used. The hard mask layer 104, in some embodiments, may be formed as a multi-layer, such as a multi-layer of two layers including a nitride and oxide (e.g., SiN and silicon dioxide ($SiO_2$)), a multi-layer of three layers including one or more nitride and one or more oxide layers (e.g., $SiN/SiO_2/SiN$, $SiO_2/SiN/SiO_2$), etc. The hard mask layer 104 may have a height or vertical thickness (in direction Y-Y') in the range of 10 nm to 100 nm, although other heights above or below this range may be used as desired for a particular application.

The vertical fins 103 may each have a width or horizontal thickness (in direction X-X') in the range of 5 nm to 20 nm, although other widths above or below this range may be used as desired for a particular application. In the FIG. 1 structure, the vertical fins 103 are only partially patterned by recessing the top surface of the substrate 102 not covered by hard mask layer 104 to a depth (in direction Y-Y') ranging from 5 nm to 20 nm.

For clarity of illustration, FIGS. 1-13 are shown and described with respect to forming a VTFET structure with two vertical fins (e.g., to form two VTFETs). In other embodiments, however, more or fewer than two vertical fins may be formed to form more or fewer than two VTFETs in the resulting VTFET structure.

FIG. 2 shows a cross-sectional view 200 of the FIG. 1 structure following formation of spacers 106. The spacers 106 will provide a portion of a top spacer in the resulting VTFET structure after further processing described below.

The spacers 106 may be formed using various processing, such as using conformal deposition and etch-back processing (e.g., atomic layer deposition (ALD), etc.). The spacers 106 may be formed of silicon dioxide (SiO$_2$), SiN, silicon carbide oxide (SiCO), silicon boron carbide nitride (SiBCN), silicon oxycarbonitride (SiOCN), etc., although other suitable materials may be used. The spacers 106 may have a width or horizontal thickness (in direction X-X') in the range of 2 nm to 20 nm, although other widths above or below this range may be used as desired for a particular application.

Figure 3:
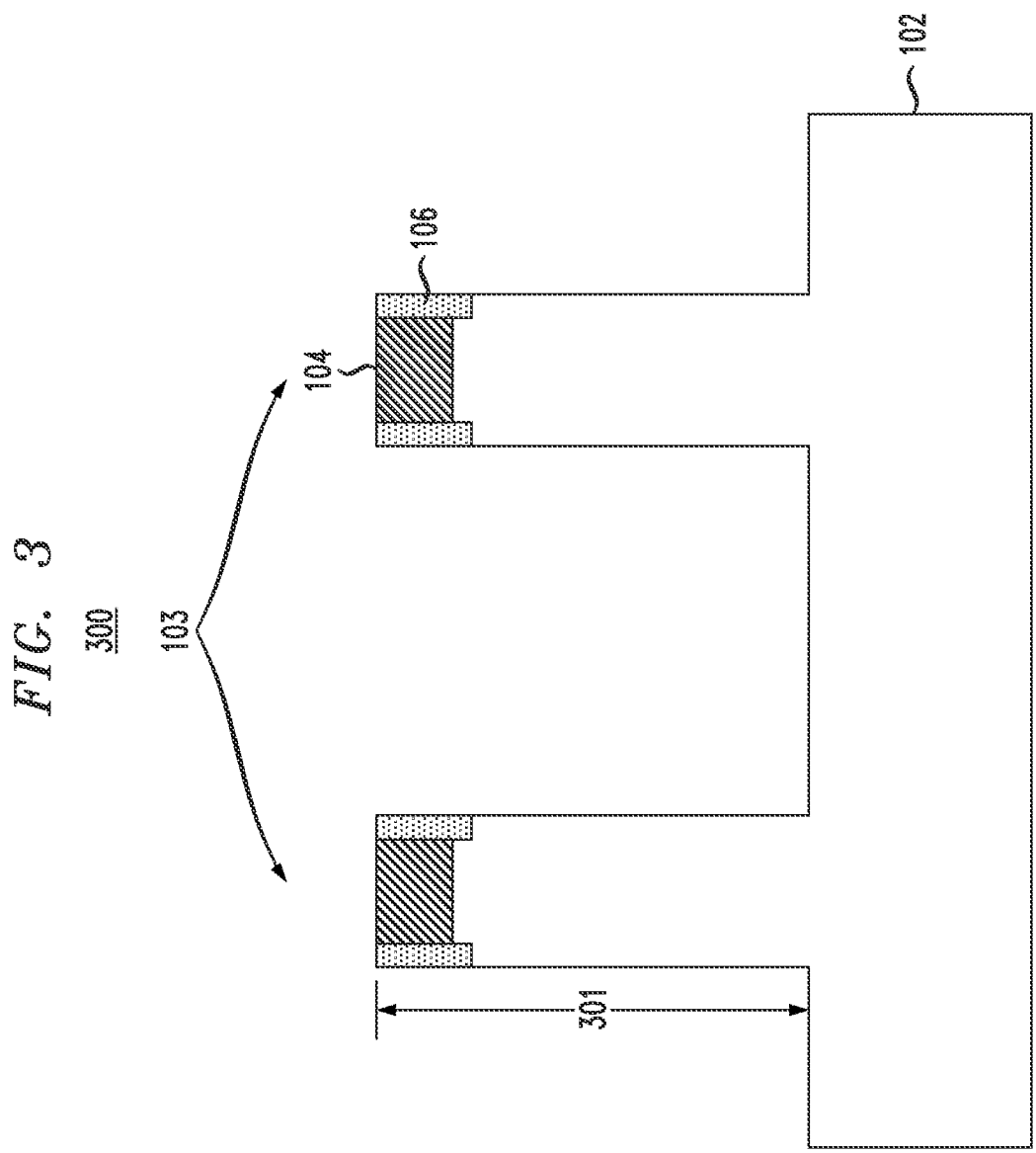
FIG. 3 depicts a cross-sectional view of the FIG. 2 structure following additional fin patterning, according to an embodiment of the invention.

FIG. 3 shows a cross-sectional view 300 of the FIG. 2 structure following additional fin patterning by recessing portions of the substrate 102 not covered by the hard mask layer 104 and spacers 106. This results in increasing the height of the vertical fins 103. For example, after the additional fin patterning of FIG. 3, each of the vertical fins 103 may have a height 301 in the range of 20 nm to 200 nm. The fin patterning shown in FIG. 3 may be achieved using various processing, including etching using reactive-ion etching (RIE). The vertical fins 103 will provide the vertical transport channels for VTFETs in the resulting VTFET structure.

Figure 4:
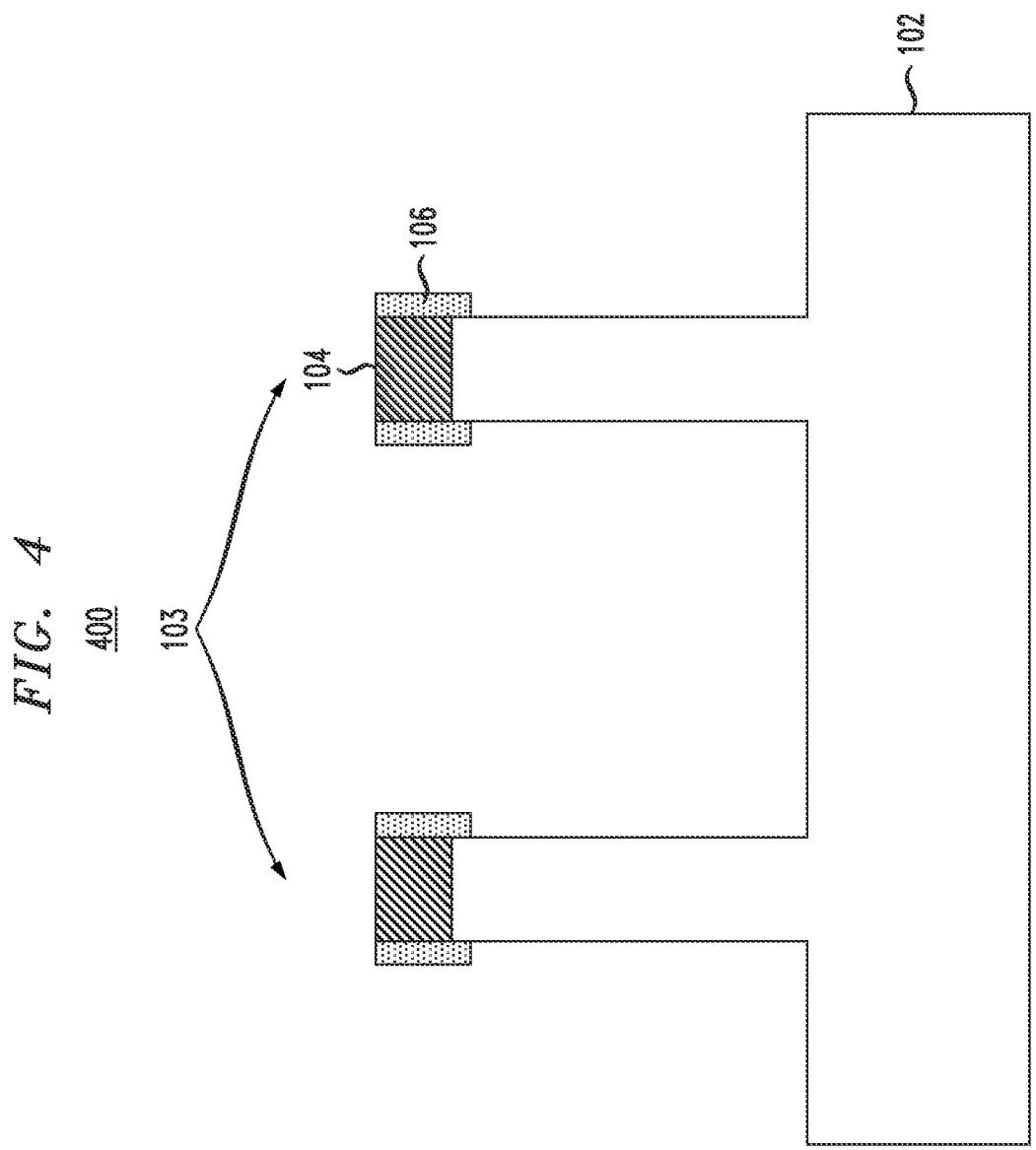
FIG. 4 depicts a cross-sectional view of the FIG. 3 structure following fin trimming, according to an embodiment of the invention.

FIG. 4 shows a cross-sectional view 400 of the FIG. 3 structure following fin trimming to remove portions of the vertical fins 103 by etching the exposed sidewalls thereof. In some embodiments, the fin trimming may be achieved using a silicon wet etch or other suitable processing. The top surface of the substrate 102 may also have material loss due to the fin trimming. The fin trimming, as shown in FIG. 4, results in thinning the vertical fins 103 the width of the spacers 106. It should be appreciated, however, that the fin trimming need not thin the vertical fins 103 the exact width of the spacers 106. Instead, the vertical fins 103 may be trimmed to a depth in the range of 2 nm to 20 nm.

FIG. 5 shows a cross-sectional view 500 of the FIG. 4 structure following formation of a bottom source/drain region 108 and formation of a bottom spacer 110.

The bottom source/drain region 108 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). The bottom source/drain region 108 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

The bottom source/drain region 108 may have a height or vertical thickness (in direction Y-Y') in the range of 20 nm to 50 nm, although other heights above or below this range may be used as desired for a particular application.

The bottom spacer 110 may be formed using various processing, such as non-conformal deposition and etch-back processing (e.g., PVD, HDP deposition, etc.). The bottom spacer 110 may be formed of SiO$_2$, SiN, SiCO, SiBCN, SiOCN, etc., although other suitable materials may be used. The bottom spacer 110 may have a height or vertical thickness (in direction Y-Y') in the range of 2 nm to 20 nm, although other heights above or below this range may be used as desired for a particular application.

Figure 6:
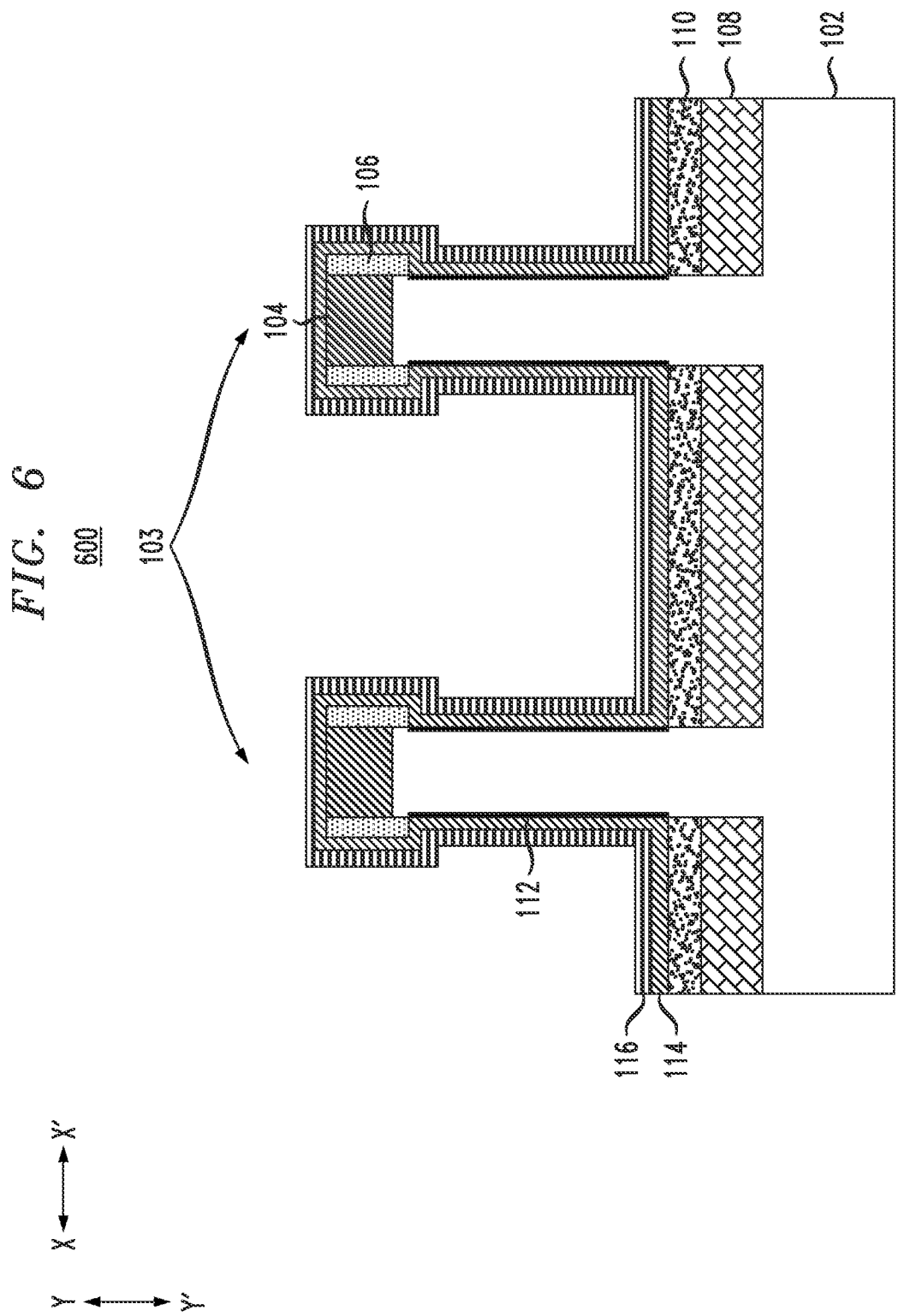
FIG. 6 depicts a cross-sectional view of the FIG. 5 structure following formation of an interfacial layer, and a gate stack, according to an embodiment of the invention.

FIG. 6 shows a cross-sectional view 600 of the FIG. 5 structure following formation of IL 112 and a gate stack including a gate dielectric 114 and gate conductor 116. The IL 112 is formed on sidewalls of the vertical fins 103 as illustrated. The IL 112 may be formed of SiO$_2$ or another suitable material such as silicon oxynitride (SiO$_x$N$_y$). In some embodiments, the IL 112 is formed using a chemical oxidation process, although other suitable processes may be used. The IL 112 may have a width or horizontal thickness (in direction X-X') ranging from 0.5 nm to 1.5 nm, although other widths above or below this range may be used as desired for a particular application.

The gate stack, as noted above, includes a gate dielectric 114 and a gate conductor 116. Each of the gate dielectric 114 and gate dielectric 116 may be formed using various processing, including using a conformal deposition process such as ALD.

In some embodiments, the gate dielectric 114 is formed of a high-k dielectric material. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The gate dielectric 114 may have a uniform thickness in the range of 1 nm to 3 nm, although other thicknesses above or below this range may be used as desired for a particular application.

The gate conductor 116 may include a metal gate, a WFM, or another suitable material. For nFET devices, the WFM for the gate conductor 116 may be titanium (Ti), aluminum (Al), titanium aluminum (TiAl), titanium aluminum carbon (TiAlC), a combination of Ti and Al alloys, a stack which includes a barrier layer (e.g., of TiN or another suitable material) followed by one or more of the aforementioned WFM materials, etc. For pFET devices, the WFM for the gate conductor 116 may be TiN, TaN, or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor 116 as desired.

The gate stack 116 may have a height or vertical thickness (in direction Y-Y') in the range of 5 nm to 20 nm, although other thicknesses above or below this range may be used as desired for a particular application.

Figure 7:
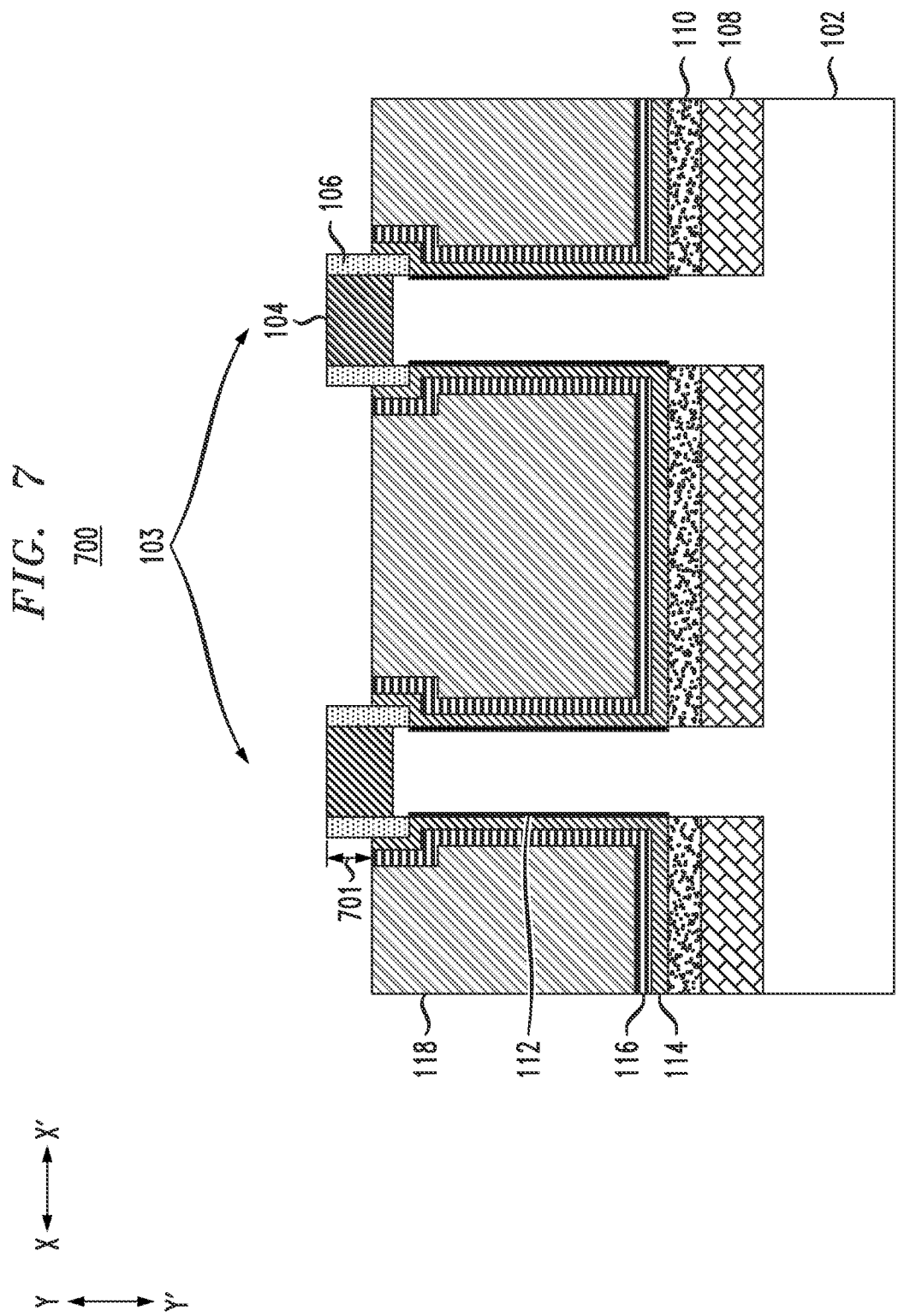
FIG. 7 depicts a cross-sectional view of the FIG. 6 structure following formation of an organic planarization layer and recess of the gate stack, according to an embodiment of the invention.

FIG. 7 shows a cross sectional view 700 of the FIG. 6 structure, following fill with OPL 118 and subsequent recess of the OPL 118, and the gate dielectric layer 114 and gate conductor layer 116 of the gate stack. The recess of the gate dielectric layer 114 and gate conductor layer 116 may utilize RIE or another suitable process. The recess exposes a portion of the sidewalls of the spacers 106, such as to a depth 701 in the range of 10 nm to 100 nm.

Figure 8:
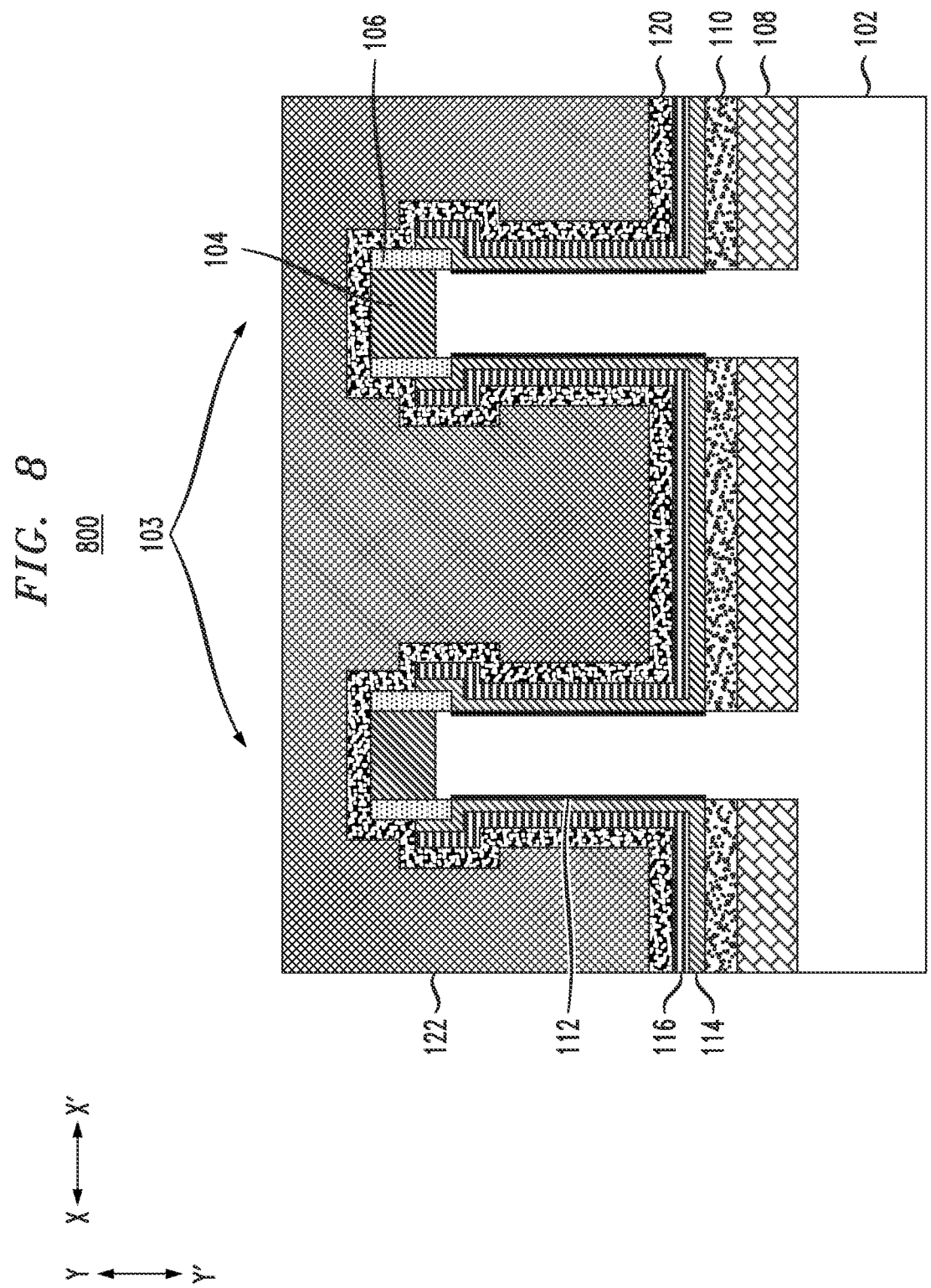
FIG. 8 depicts a cross-sectional view of the FIG. 7 structure following removal of the organic planarization layer, formation of a gate encapsulation layer, and fill with an interlayer dielectric, according to an embodiment of the invention.

FIG. 8 shows a cross-sectional view 800 of the FIG. 7 structure following removal of the OPL 118, formation of a gate encapsulation layer 120, and fill with an oxide or interlayer dielectric (ILD) layer 122.

The gate encapsulation layer 120 may be formed of a nitride such as SiN, SiCN, SiBCN, SiOCN, etc. The gate encapsulation layer 120 may be formed using processing such as chemical vapor deposition (CVD), plasma-enhanced chemical vapor deposition (PECVD), ALD, etc. The encapsulation layer 120 may have a uniform thickness in the range of 3 nm to 15 nm, although other thicknesses above or below this range may be used as desired for a particular application.

The oxide or ILD layer 122 may be formed of a flowable oxide, such as using FCVD processing. The oxide or ILD layer 122 is formed to completely cover the structure below (e.g., with a height that exceeds that of the top of the gate encapsulation layer 120 formed over the hard mask layer 104 of each of the vertical fins 103).

Figure 9:
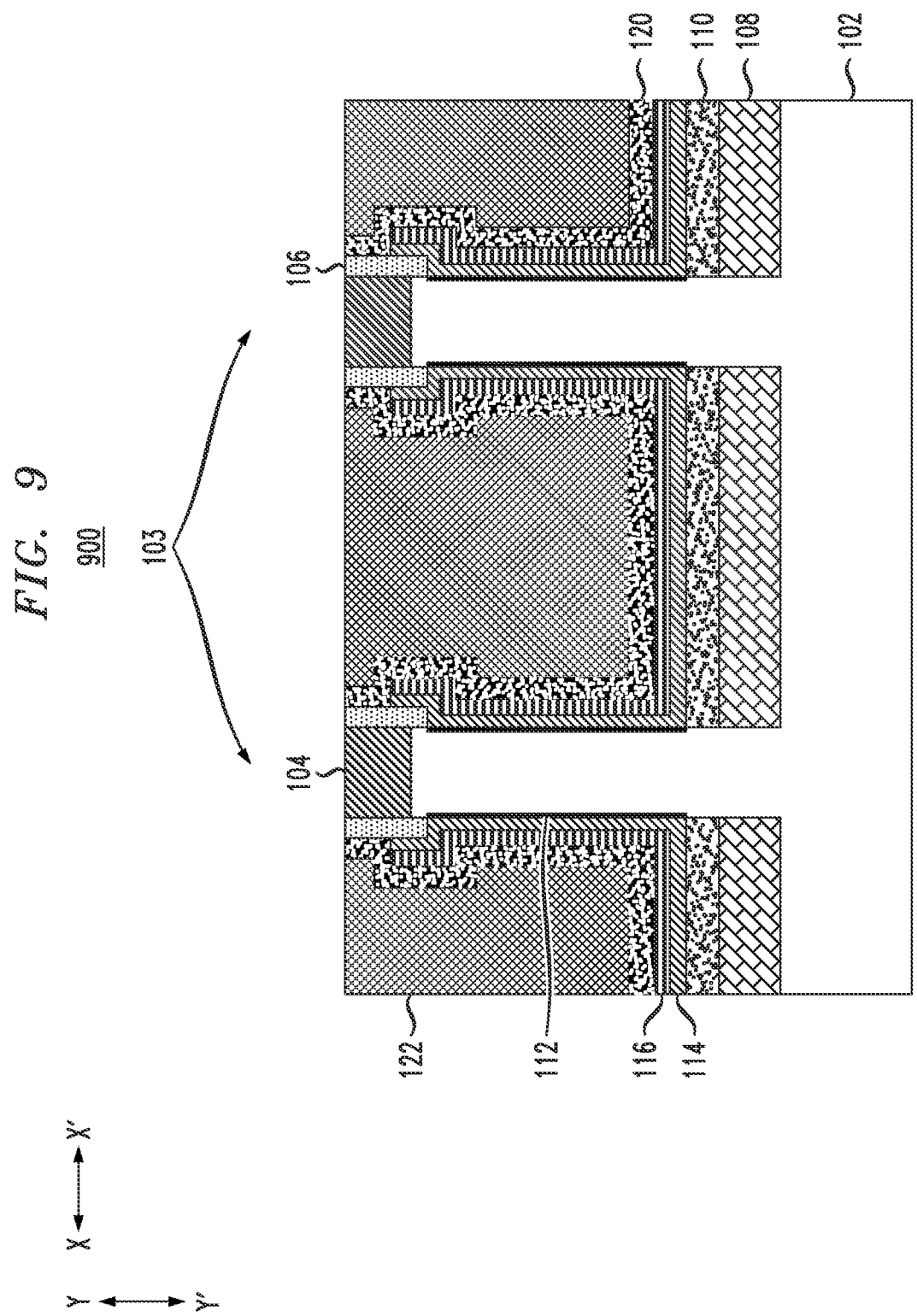
FIG. 9 depicts a cross-sectional view of the FIG. 8 structure following planarization, according to an embodiment of the invention.

FIG. 9 shows a cross-sectional view 900 of the FIG. 8 structure following planarization, such as using CMP, down to expose a top surface of the hard mask layer 104.

Figure 10:
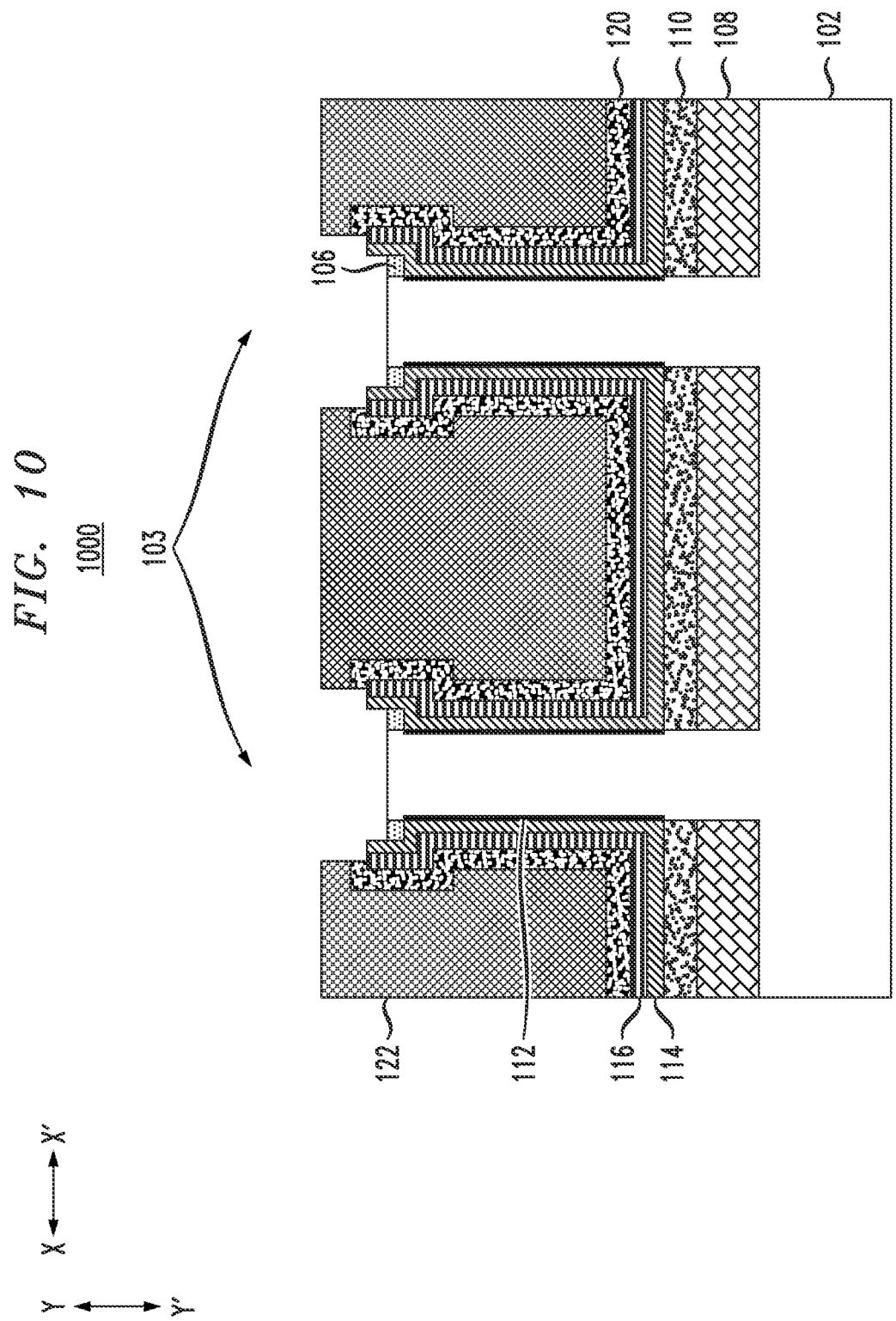
FIG. 10 depicts a cross-sectional view of the FIG. 9 structure following removal of the hard mask, according to an embodiment of the invention.

FIG. 10 shows a cross-sectional view 1000 of the FIG. 9 structure, following removal of the hard mask layer 104. The hard mask layer 104 may be removed using RIE, a wet etch or another suitable process. Removal of the hard mask layer 104 also results in removal of a portion of the spacers 106, though as shown in FIG. 10 a portion of the spacers 106 remains (e.g., that portion of the spacers 106 that is formed below the bottom surface of the hard mask layer 104 but above the underlying gate dielectric layer 114). Removal of the hard mask layer 104 also results in removal of portions of the gate encapsulation layer 120 that are exposed by the planarization processing of FIG. 9.

Figure 11:
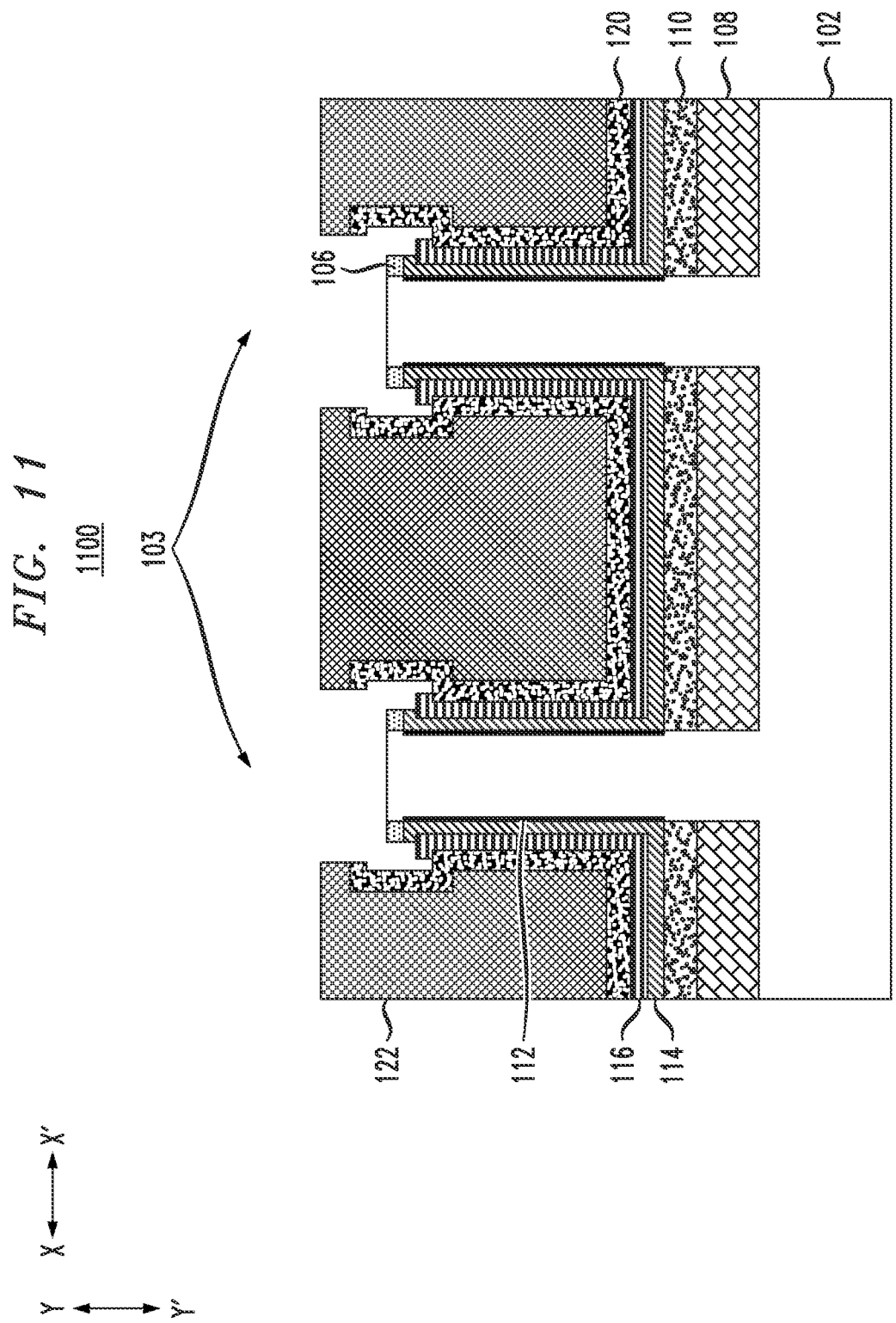
FIG. 11 depicts a cross-sectional view of the FIG. 10 structure following recess of the gate stack, according to an embodiment of the invention.

FIG. 11 shows a cross-sectional view 1100 of the FIG. 10 structure following recess of the gate stack. The gate stack may be recessed using RIE, a wet etch, or another suitable process. As illustrated, the portions of the gate dielectric layer 114 not covered by the remaining portions of the spacers 106 are removed. The gate conductor layer 116 is also recessed as shown.

Figure 12:
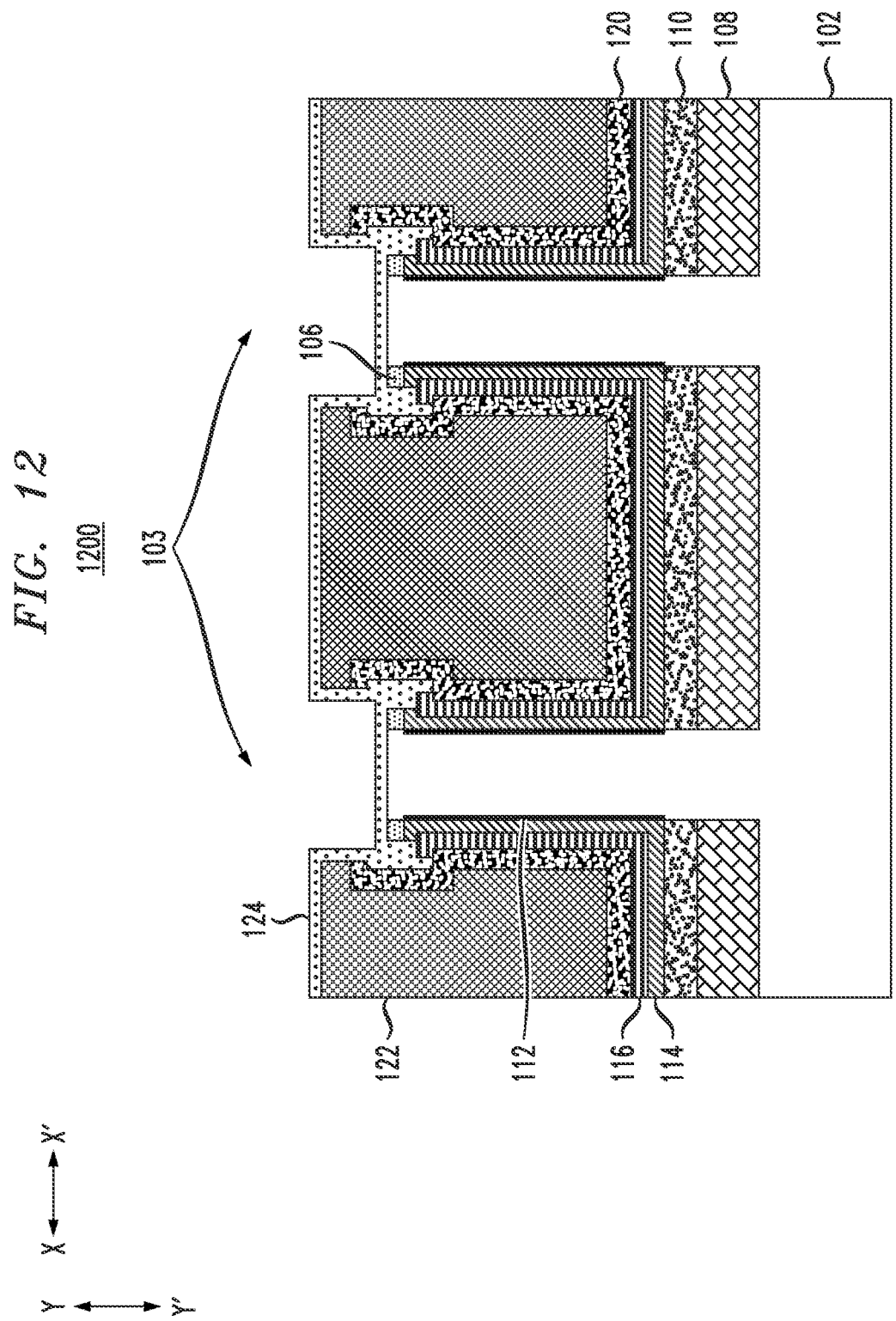
FIG. 12 depicts a cross-sectional view of the FIG. 11 structure following deposition of spacer material to fill the space formed by recess of the gate stack, according to an embodiment of the invention.

FIG. 12 shows a cross-sectional view 1200 of the FIG. 11 structure following formation of additional spacer material 124. The additional spacer material 124 may be a nitride material similar to that used for spacers 106 or nitride material such as SiN, SiCN, SiBCN, SiOCN, etc. The additional spacer material 124 may be formed using a divot deposition process (e.g., divot nitride deposition). In some embodiments, this includes ALD of a nitride material to pinch off the space formed by recess of the gate stack shown in FIG. 11.

Figure 13:
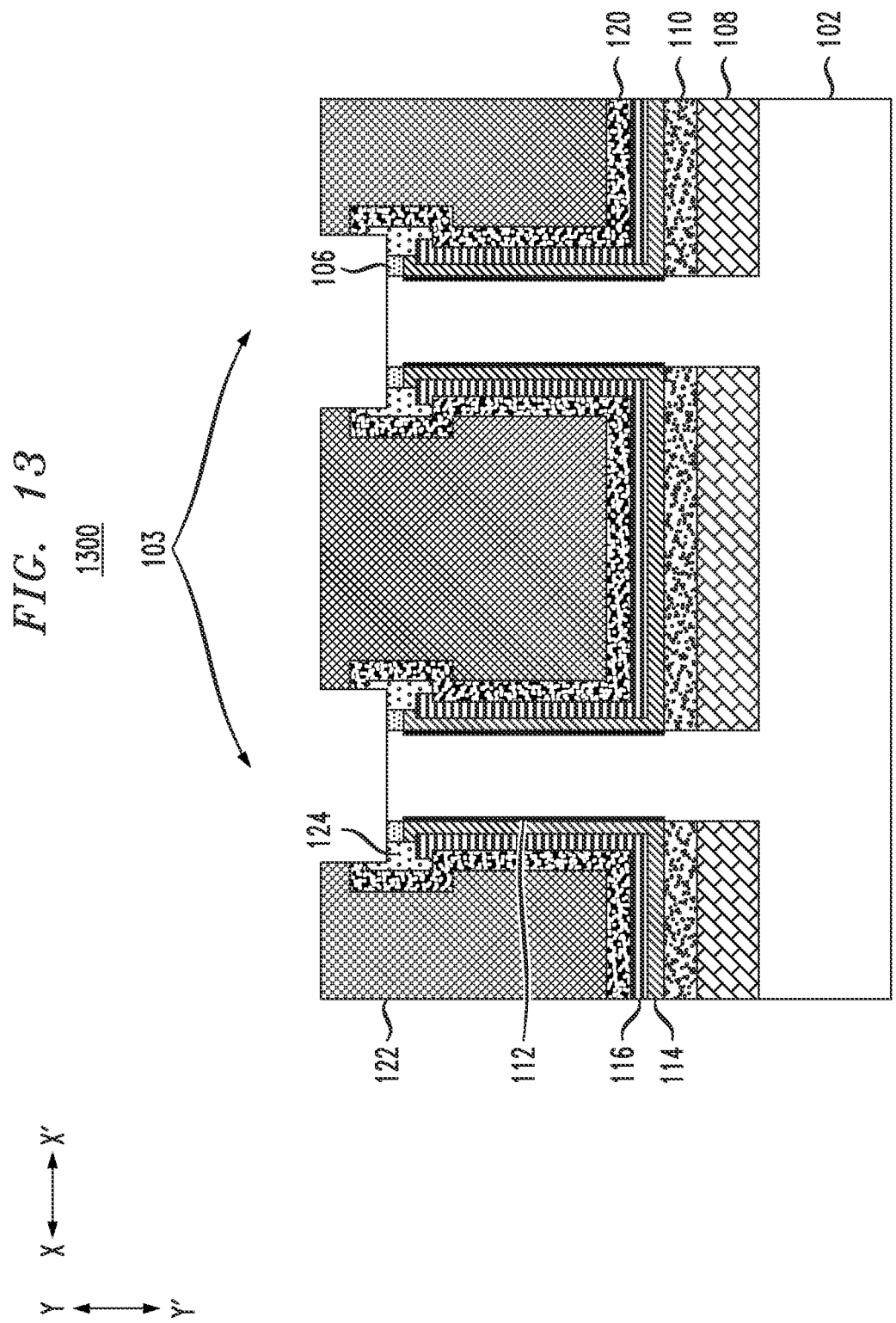
FIG. 13 depicts a cross-sectional view of the FIG. 12 structure following formation of top spacers by etch-back of the spacer material, according to an embodiment of the invention.

FIG. 13 shows a cross-sectional view 1300 of the FIG. 12 structure following etch-back processing to remove portions of the additional spacer material 124 deposited as described above with respect to FIG. 12. The etch-back processing may utilize a conformal nitride etch-back or other suitable processing to result in the structure shown in FIG. 13. The remaining portion of the spacers 106 and the additional spacer material 124 collectively provide the top spacer for the resulting VTFET structure.

Figure 14:
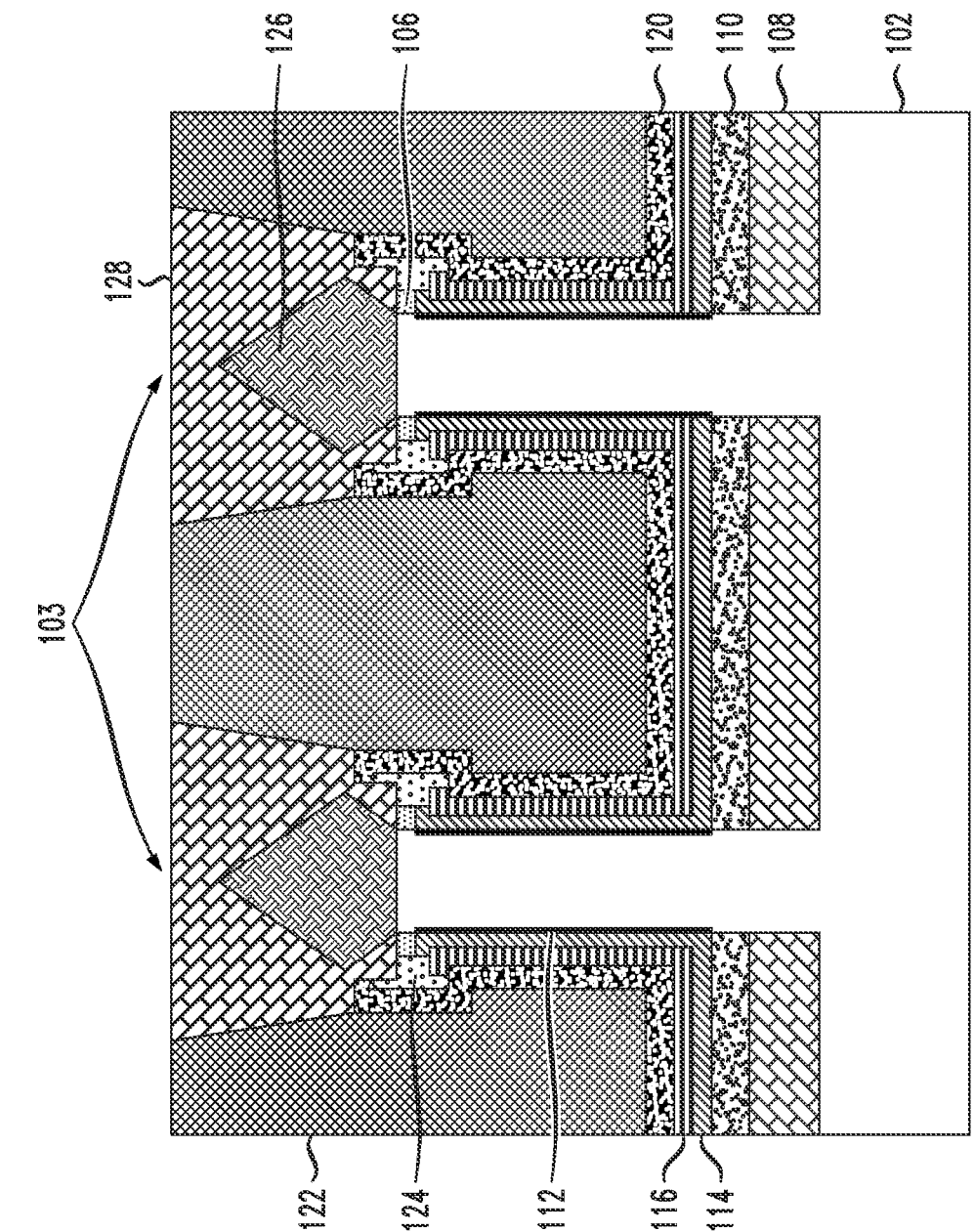
FIG. 14 depicts a cross-sectional view of the FIG. 13 structure following formation of top source/drain regions and top contacts, according to an embodiment of the invention.

FIG. 14 shows a cross-sectional view 1400 of the FIG. 13 structure following formation of top source/drain regions 126 and top contacts 128. The top source/drain regions 126 may be formed using similar processing and materials as that described above with respect to the bottom source/drain region 108. The top source/drain regions 126 may have a width or horizontal thickness (in direction X-X') at the widest point in the range of 5 nm to 30 nm, and a height or vertical thickness (in direction Y-Y') at the tallest point in the range of 5 nm to 30 nm.

The top contacts 128 may be formed using any suitable deposition process, such as PVD, CVD, ALD, etc. The top contacts 128 may be formed of tungsten (W) or another suitable material such as cobalt (Co). Prior to formation of the top contacts 128, the structure may be filled with additional oxide or ILD 122, followed by masking and patterning the oxide or ILD 122 to form openings in which the material for the top contacts 128 is deposited.

In some embodiments, a method of forming a semiconductor structure comprises patterning a hard mask layer over a top surface of a substrate, forming a first portion of one or more vertical fins below the patterned hard mask layer, forming a top spacer on sidewalls of the hard mask layer and the first portion of the one or more vertical fins, forming a second portion of the one or more vertical fins in the substrate below the top spacer, trimming sidewalls of the second portion of the one or more vertical fins, and forming an IL on the trimmed sidewalls of the second portion of the one or more vertical fins. The one or more vertical fins provide one or more vertical transport channels for one or more VTFETs.

The method may further comprise removing the hard mask layer and at least a first portion of the top spacer, a second portion of the top spacer remaining to protect the IL such that the IL has a uniform thickness.

The method may further comprise forming a gate stack over the IL, the gate stack proximate the top surface of the one or more vertical fins below the top spacer having an inverted-L shape profile.

In some embodiments, forming the first portion of the one or more vertical fins comprises etching portions of the substrate exposed by the patterned hard mask layer to a first depth, forming the second portion of the one or more vertical fins comprises etching portions of the substrate exposed by the patterned hard mask layer to a second depth, and trimming the sidewalls of the second portion of the one or more vertical fins comprises etching the sidewalls of the second portion of the one or more vertical fins.

The method may further comprise forming a bottom source/drain region over the top surface of the substrate and surrounding a first portion of the sidewalls of the second portion of the one or more vertical fins, and forming a bottom spacer over a top surface of the bottom source/drain region and surrounding a second portion of the sidewalls of the second portion of the one or more vertical fins.

Forming the IL may comprise forming the IL on a third portion of the sidewalls of the second portion of the one or more vertical fins. The IL may be formed by performing a chemical oxidation of exposed portions of the sidewalls of the second portion of the one or more vertical fins.

The method may further comprise forming a gate dielectric layer over a top surface of the bottom spacer, the IL, the first top spacers and the hard mask layer, and forming a gate conductor layer over the gate dielectric layer.

The method may further comprise recessing the gate dielectric layer and the gate conductor layer below a top surface of the hard mask layer and above a bottom surface of the top spacer, forming a gate encapsulation layer disposed over the gate dielectric layer, the gate dielectric layer, exposed portions of the top spacer, and the top surface of the hard mask layer, and filling an ILD disposed over the gate encapsulation layer.

The method may further comprise planarizing the ILD to remove portions of the gate encapsulation layer and expose the top surface of the hard mask layer, and removing the hard mask layer, exposed portions of the gate encapsulation layer disposed over the gate conductor layer and the gate dielectric layer, and a portion of the top spacer.

The method may further comprise recessing the gate conductor layer to remove portions of the gate conductor layer exposed by removal of the exposed portions of the gate encapsulation layer, and recessing the gate dielectric layer to remove portions of the gate dielectric layer over the gate conductor layer exposed by recess of the gate conductor layer.

The method may further comprise forming additional spacer material for the top spacer over exposed portions of the gate conductor layer and the gate conductor layer in a divot space defined by the gate encapsulation layer.

The method may further comprise forming top source/drain regions over top surfaces of the one or more fins, forming top contacts to the top source/drain regions, and forming additional ILD surrounding the top contacts.

In some embodiments, a semiconductor structure comprises a substrate, one or more vertical fins disposed over a top surface of the substrate, the one or more vertical fins comprising a first portion proximate top surfaces thereof and a second portion below the first portion, a top spacer disposed on sidewalls of the first portion of the one or more vertical fins, and an IL disposed on sidewalls of the second portion of the one or more vertical fins. The one or more vertical fins provide vertical transport channels for one or more VTFETs.

In some embodiments, the first top spacers protect the IL such that the IL has a uniform thickness.

The semiconductor structure may further comprise a gate stack disposed over the IL, the gate stack proximate the top surface of the one or more vertical fins below the top spacer having an inverted-L shape profile.

The semiconductor structure may further comprise a bottom source/drain region disposed over the top surface of the substrate and surrounding a first portion of the sidewalls of the second portion of the one or more vertical fins, a bottom spacer disposed over a top surface of the bottom source/drain region and surrounding a second portion of the sidewalls of the second portion of the one or more vertical fins, the IL disposed on a third portion of the sidewalls of the second portion of the one or more vertical fins, a gate stack disposed over a top surface of the bottom spacer and on the IL, a gate encapsulation layer disposed over the gate stack, the top spacer comprising: (i) a first portion disposed on sidewalls of the first portion of the one or more vertical fins; and (ii) a second portion filling a divot between the gate encapsulation layer and the gate stack, top source/drain regions disposed over top surfaces of the one or more vertical fins, top contacts disposed over the top source/drain regions, and an ILD disposed over the gate encapsulation layer and surrounding the top contacts.

In another embodiment, an integrated circuit comprises a VTFET structure comprising a substrate, one or more vertical fins disposed over a top surface of the substrate, the one or more vertical fins comprising a first portion proximate top surfaces thereof and a second portion below the first portion, top spacers disposed on sidewalls of the first portion of the one or more vertical fins, and an IL disposed on sidewalls of the second portion of the one or more vertical fins. The one or more vertical fins provide vertical transport channels for one or more VTFETs.

The VTFET structure may further comprise a gate stack disposed over the IL, the gate stack proximate the top surface of the one or more vertical fins below the top spacer having an inverted-L shape profile.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    patterning a hard mask layer over a top surface of a substrate;
    forming a first portion of one or more vertical fins below the patterned hard mask layer;
    forming a top spacer on sidewalls of the hard mask layer and the first portion of the one or more vertical fins;
    forming a second portion of the one or more vertical fins in the substrate below the top spacer;
    trimming sidewalls of the second portion of the one or more vertical fins;
    forming an interfacial layer on the trimmed sidewalls of the second portion of the one or more vertical fins;
    forming a gate stack over the interfacial layer, the gate stack comprising:
        a gate dielectric layer; and
        a gate conductor layer;
    forming a gate encapsulation layer surrounding at least a first portion of the gate conductor layer;
    forming a divot space defined by the gate encapsulation layer and a second portion of the gate conductor layer by removing a portion of the gate dielectric layer and the gate conductor layer, so that the gate dielectric layer has an inverted-L shape profile proximate the top surface of the one or more vertical fins and the gate conductor layer has an inverted-L shape profile below the inverted-L shape profile of the gate dielectric layer, a top surface of the gate conductor layer being below a top surface of the gate dielectric layer; and
    forming additional spacer material for the top spacer in the divot space;
    wherein the one or more vertical fins provide one or more vertical transport channels for one or more vertical transport field-effect transistors.

2. The method of claim 1, further comprising removing the hard mask layer and a first portion of the top spacer, a second portion of the top spacer remaining to protect the interfacial layer such that the interfacial layer has a uniform thickness.

3. The method of claim 1, wherein:
    forming the first portion of the one or more vertical fins comprises etching portions of the substrate exposed by the patterned hard mask layer to a first depth;
    forming the second portion of the one or more vertical fins comprises etching portions of the substrate exposed by the patterned hard mask layer to a second depth; and
    trimming the sidewalls of the second portion of the one or more vertical fins comprises etching the sidewalls of the second portion of the one or more vertical fins.

4. The method of claim 3, further comprising:
    forming a bottom source/drain region over a top surface of the portions of the substrate exposed by the patterned hard mask layer etched to the second depth and surrounding a first portion of the sidewalls of the second portion of the one or more vertical fins; and
    forming a bottom spacer over a top surface of the bottom source/drain region and surrounding a second portion of the sidewalls of the second portion of the one or more vertical fins.

5. The method of claim 4, wherein forming the interfacial layer comprises forming the interfacial layer on a third portion of the sidewalls of the second portion of the one or more vertical fins.

6. The method of claim 5, wherein forming the interfacial layer comprises performing a chemical oxidation of exposed portions of the sidewalls of the second portion of the one or more vertical fins.

7. The method of claim 5, further comprising:
    forming the gate dielectric layer over a top surface of the bottom spacer, the interfacial layer, the first top spacers and the hard mask layer; and
    forming the gate conductor layer over the gate dielectric layer.

8. The method of claim 7, further comprising:
    recessing the gate dielectric layer and the gate conductor layer below a top surface of the hard mask layer and above a bottom surface of the top spacer;
    forming the gate encapsulation layer disposed over the gate dielectric layer, the gate conductor layer, exposed portions of the top spacer, and the top surface of the hard mask layer; and
    filling an interlayer dielectric disposed over the gate encapsulation layer.

9. The method of claim 8, further comprising planarizing the interlayer dielectric to remove portions of the gate encapsulation layer and expose the top surface of the hard mask layer.

10. The method of claim 9, further comprising removing the hard mask layer, exposed portions of the gate encapsulation layer disposed over the gate conductor layer and the gate dielectric layer, and a portion of the top spacer.

11. The method of claim 1, wherein the inverted-L shape profile of the gate dielectric layer comprises:
    a first vertically oriented portion adjacent sidewalls of the interfacial layer; and
    a first horizontally oriented portion extending from an upper portion of the first vertically oriented portion below a bottom surface of the top spacer.

12. The method of claim 11, wherein the inverted-L shape profile of the gate conductor layer comprises:
    a second vertically oriented portion adjacent sidewalls of the first vertically oriented portion of the gate dielectric layer; and
    a second horizontally oriented portion extending from an upper portion of the second vertically oriented portion of the gate conductor layer below a bottom surface of the first horizontally oriented portion of the gate dielectric layer.

13. The method of claim 12, wherein at least a portion of a top surface of the second horizontally oriented portion of the gate conductor layer is exposed by the first horizontally oriented portion of the gate dielectric layer.

14. The method of claim 1, wherein the first top spacers protect the interfacial layer such that the interfacial layer has a uniform thickness.

15. A method of forming a semiconductor structure, comprising:
    patterning a hard mask layer over a top surface of a substrate;
    forming a first portion of one or more vertical fins below the patterned hard mask layer;
    forming a top spacer on sidewalls of the hard mask layer and the first portion of the one or more vertical fins;
    forming a second portion of the one or more vertical fins in the substrate below the top spacer;
    trimming sidewalls of the second portion of the one or more vertical fins;
    forming a bottom source/drain region over a too surface of the portions of the substrate exposed by the patterned hard mask layer etched to the second depth and surrounding a first portion of the sidewalls of the second portion of the one or more vertical fins;

forming a bottom spacer over a top surface of the bottom source/drain region and surrounding a second portion of the sidewalls of the second portion of the one or more vertical fins;

forming an interfacial layer on the trimmed sidewalls of the second portion of the one or more vertical fins;

forming a gate dielectric layer over a top surface of the bottom spacer, the interfacial layer, the first top spacers and the hard mask layer;

forming a gate conductor layer over the gate dielectric layer;

recessing the gate dielectric layer and the gate conductor layer below a top surface of the hard mask layer and above a bottom surface of the top spacer;

forming a gate encapsulation layer disposed over the gate dielectric layer, the gate dielectric layer, exposed portions of the too spacer, and the too surface of the hard mask layer:

filling an interlayer dielectric disposed over the gate encapsulation layer;

planarizing the interlayer dielectric to remove portions of the gate encapsulation layer and expose the top surface of the hard mask layer;

removing the hard mask layer, exposed portions of the gate encapsulation layer disposed over the gate conductor layer and the gate dielectric layer, and a portion of the to spacer;

recessing the gate conductor layer to remove portions of the gate conductor layer exposed by removal of the exposed portions of the gate encapsulation layer; and recessing the gate dielectric layer to remove portions of the gate dielectric layer over the gate conductor layer exposed by recess of the gate conductor layer;

wherein the one or more vertical fins provide one or more vertical transport channels for one or more vertical transport field-effect transistors;

wherein forming the first portion of the one or more vertical fins comprises etching portions of the substrate exposed by the patterned hard mask layer to a first depth;

wherein forming the second portion of the one or more vertical fins comprises etching portions of the substrate exposed by the patterned hard mask layer to a second depth;

wherein trimming the sidewalls of the second portion of the one or more vertical fins comprises etching the sidewalls of the second portion of the one or more vertical fins;

wherein forming the interfacial layer comprises forming the interfacial layer on a third portion of the sidewalls of the second portion of the one or more vertical fins.

16. The method of claim 15, further comprising forming additional spacer material for the top spacer over exposed portions of the gate conductor layer and the gate conductor layer in a divot space defined by the gate encapsulation layer.

17. The method of claim 16, further comprising:

forming top source/drain regions over top surfaces of the one or more fins;

forming top contacts to the top source/drain regions; and forming additional interlayer dielectric surrounding the top contacts.

* * * * *